US012623901B2

(12) United States Patent
Jiang et al.

(10) Patent No.: US 12,623,901 B2
(45) Date of Patent: May 12, 2026

(54) HIERARCHICAL SILICON NANOSTRUCTURES, METHODS OF MAKING, AND METHODS OF USE

(71) Applicant: University of Florida Research Foundation, Inc., Gainesville, FL (US)

(72) Inventors: Peng Jiang, Gainesville, FL (US); Zhuxiao Gu, Gainesville, FL (US); Calen Leverant, Gainesville, FL (US)

(73) Assignee: University of Florida Research Foundation, INC., Gainesville, FL (US)

( * ) Notice: Subject to any disclaimer, the term of this patent is extended or adjusted under 35 U.S.C. 154(b) by 495 days.

(21) Appl. No.: 18/023,178

(22) PCT Filed: Aug. 26, 2021

(86) PCT No.: PCT/US2021/047741
§ 371 (c)(1),
(2) Date: Feb. 24, 2023

(87) PCT Pub. No.: WO2022/047021
PCT Pub. Date: Mar. 3, 2022

(65) Prior Publication Data
US 2023/0312336 A1      Oct. 5, 2023

Related U.S. Application Data

(60) Provisional application No. 63/071,503, filed on Aug. 28, 2020.

(51) Int. Cl.
G02B 1/118      (2015.01)
B81C 1/00      (2006.01)
B82Y 20/00      (2011.01)

(52) U.S. Cl.
CPC .......... *B81C 1/00031* (2013.01); *G02B 1/118* (2013.01); *B81B 2203/0361* (2013.01); *B81B 2207/056* (2013.01); *B82Y 20/00* (2013.01)

(58) Field of Classification Search
CPC ............... B81C 1/00031; G02B 1/118; B81B 2203/0361; B81B 2207/056; B82Y 20/00; B82Y 30/00
See application file for complete search history.

(56) References Cited

U.S. PATENT DOCUMENTS 7,361,430 B1 *   4/2008   Gennett ................ B81B 3/0021
                                                      977/932
8,553,333 B2 *   10/2013   Chang ................. C23C 18/1212
                                                      428/323

(Continued)

OTHER PUBLICATIONS

Examiner provided PDF of Fabrication of Micro-and nanopillars, of record, Jul. 31, 2019 (Year: 2019).*

(Continued)

*Primary Examiner* — Bumsuk Won
*Assistant Examiner* — John Curtis Sipes
(74) *Attorney, Agent, or Firm* — Thomas Horstemeyer LLP.

(57) ABSTRACT

Described herein are antireflective materials and methods of making antireflective materials. The material can include a plurality of hierarchical nanostructures on abase substrate and a total specular reflection of less than 3% at a wavelength of about 400 nm to about 1100 nm. The material can have an etched polyimide layer disposed on the superior surface of the hierarchical nanostructures. The materials can also have superhydrophobic characteristics.

13 Claims, 6 Drawing Sheets

(56)  References Cited

U.S. PATENT DOCUMENTS

| | | | |
|---|---|---|---|
| 10,882,739 B2 * | 1/2021 | Black | G03F 7/405 |
| 2008/0176074 A1 * | 7/2008 | Lee | B29C 67/08 |
| | | | 264/319 |
| 2013/0295327 A1 * | 11/2013 | Zhang | B82Y 30/00 |
| | | | 428/141 |
| 2015/0126393 A1 | 5/2015 | Corn et al. | |
| 2015/0202834 A1 * | 7/2015 | Free | G02B 1/118 |
| | | | 156/60 |
| 2016/0254395 A1 | 9/2016 | Jiang et al. | |
| 2016/0304341 A1 * | 10/2016 | Bright | C23C 16/45525 |
| 2016/0332415 A1 * | 11/2016 | Lyons | G02B 1/00 |
| 2017/0361551 A1 * | 12/2017 | Donnelly | B29D 11/00365 |
| 2018/0066131 A1 * | 3/2018 | Jin | B82Y 30/00 |
| 2020/0098577 A1 * | 3/2020 | Xu | H01L 21/3065 |

OTHER PUBLICATIONS

Evolutionary algorithms converge toward evolved biological photonic structures, Jul. 14, 2020 (Year: 2020).*

ISR Mailed Nov. 30, 2021, International Patent Application PCT/US2021/047741 Filed Aug. 26, 2021.

Heikkinen, et al. "Fabrication of micro-and nanopillars from pyrolytic carbon and tetrahedral amorphous carbon." Micromachines 10.8 (2019): 510, Fig 2h, 5a-5d; p. 5-9 [online] https://www.mdpi.com/2072-666X/10/8/510/htm.

* cited by examiner

HIERARCHICAL SILICON NANOSTRUCTURES, METHODS OF MAKING, AND METHODS OF USE

CROSS-REFERENCE TO RELATED APPLICATIONS

This application is the 35 U.S.C. § 371 national stage of PCT application having serial number PCT/US2021/047741, filed on Aug. 26, 2021. This application also claims priority to U.S. provisional application having Ser. No. 63/071,503 filed on Aug. 28, 2020, which are entirely incorporated herein by reference.

STATEMENT REGARDING FEDERALLY SPONSORED RESEARCH OR DEVELOPMENT

This invention was made with government support under Grant No. 1562861, awarded by the National Science Foundation. The government has certain rights in the invention.

BACKGROUND

Materials having improved antireflective and self-cleaning properties are needed for various applications, including solar cells and surface-enhanced Raman scattering (SERS) sensors.

SUMMARY

Embodiments of the present disclosure provide antireflective materials, methods of making antireflective materials, and the like.

An embodiment of the present disclosure includes antireflective materials that include a plurality of hierarchical nanostructures on a base substrate, where the hierarchical nanostructures include concave nanoposts. The nanoposts are filled with a plurality of nanocones. The material can have a total specular reflection of less than 3% at a wavelength of about 400 nm to about 1100 nm. The material can include an etched polyimide layer disposed on the superior surface of the hierarchical nanostructures.

An embodiment of the present disclosure includes antireflective materials that include a plurality of hierarchical nanostructures on a base substrate, wherein the hierarchical nanostructures comprise concave nanoposts filled with a plurality of nanocones.

An embodiment of the present disclosure also includes methods of making an antireflective material. The methods can include disposing a mask comprising an array of templating nanoparticles on a top surface of a base substrate and etching the top surface of the base substrate. The templating nanoparticles are removed, and the removal of the templating nanoparticles forms concave nanoposts. A polyimide layer can be disposed on the concave nanoposts and the polyimide layer etched to form hierarchical nanocylinders that include nanocones in concave nanoposts.

Other compositions, apparatus, methods, features, and advantages will be or become apparent to one with skill in the art upon examination of the following drawings and detailed description. It is intended that all such additional compositions, apparatus, methods, features and advantages be included within this description, be within the scope of the present disclosure, and be protected by the accompanying claims.

BRIEF DESCRIPTION OF THE DRAWINGS

Further aspects of the present disclosure will be more readily appreciated upon review of the detailed description of its various embodiments, described below, when taken in conjunction with the accompanying drawings.

FIG. 2A is a top view of the nanocylinders after the completion of the first etch using 1 μm SiNPs as the templating mask which are dissolved in HF. FIG. 2B is a top view of the nanocylinders with a clear boundary. FIG. 2C is a tilted (30°) view of the hierarchical nanocylinders and black silicon (BSi) surface. FIGS. 2D-2F are magnified images of hierarchical nanocylinders captured, each is more distant to the polyimide tape. FIGS. 2G and 2H are side views of the nanocylinders resulting from highly anisotropic etching.

FIG. 4B, hNCs etched once; FIG. 4C., hNCs templated from 1 μm SiNPs with tape; FIG. 4D, hNCs templated from 700 nm SiNPs with tape; FIG. 4E, BSi for 30 mins; FIG. 4F, BSi for 20 min.

Figure 1:
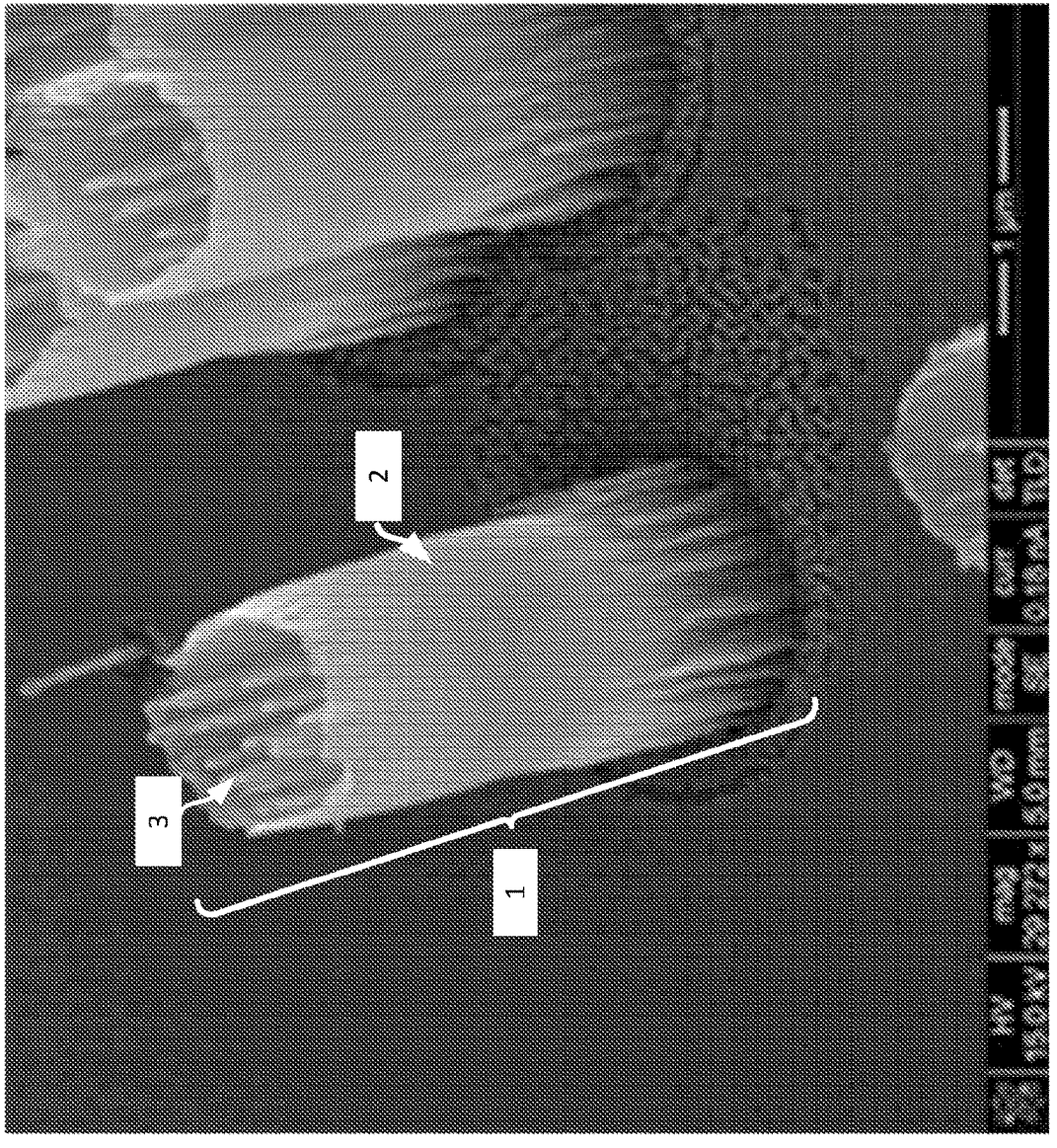
FIG. 1 is a scanning electron microscope (SEM) image of 700 nm-SiNPs-templated hierarchical nanocylinders (hNCs) in accordance with embodiments of the present disclosure.

The drawings illustrate only example embodiments and are therefore not to be considered limiting of the scope described herein, as other equally effective embodiments are within the scope and spirit of this disclosure.

DETAILED DESCRIPTION

Before the present disclosure is described in greater detail, it is to be understood that this disclosure is not limited to particular embodiments described, and as such may, of course, vary. It is also to be understood that the terminology used herein is for the purpose of describing particular embodiments only, and is not intended to be limiting, since the scope of the present disclosure will be limited only by the appended claims.

Where a range of values is provided, it is understood that each intervening value, to the tenth of the unit of the lower limit unless the context clearly dictates otherwise, between the upper and lower limit of that range and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, the preferred methods and materials are now described.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method can be carried out in the order of events recited or in any other order that is logically possible.

Embodiments of the present disclosure will employ, unless otherwise indicated, techniques of chemistry, material science, and the like, which are within the skill of the art.

The following examples are put forth so as to provide those of ordinary skill in the art with a complete disclosure and description of how to perform the methods and use the structures and materials disclosed and claimed herein. Efforts have been made to ensure accuracy with respect to numbers (e.g., amounts, temperature, etc.), but some errors and deviations should be accounted for. Unless indicated otherwise, parts are parts by weight, temperature is in ° C., and pressure is at or near atmospheric. Standard temperature and pressure are defined as 20° C. and 1 atmosphere.

Before the embodiments of the present disclosure are described in detail, it is to be understood that, unless otherwise indicated, the present disclosure is not limited to particular materials, reagents, reaction materials, manufacturing processes, or the like, as such can vary. It is also to be understood that the terminology used herein is for purposes of describing particular embodiments only, and is not intended to be limiting. It is also possible in the present disclosure that steps can be executed in different sequence where this is logically possible.

It must be noted that, as used in the specification and the appended claims, the singular forms "a," "an," and "the" include plural referents unless the context clearly dictates otherwise.

As used herein, the following terms have the meanings ascribed to them unless specified otherwise. In this disclosure, "consisting essentially of" or "consists essentially" or the like, when applied to methods and compositions encompassed by the present disclosure refers to compositions like those disclosed herein, but which may contain additional structural groups, composition components or method steps (or analogs or derivatives thereof as discussed above). Such additional structural groups, composition components or method steps, etc., however, do not materially affect the basic and novel characteristic(s) of the compositions or methods, compared to those of the corresponding compositions or methods disclosed herein. "Consisting essentially of" or "consists essentially" or the like, when applied to methods and compositions encompassed by the present disclosure have the meaning ascribed in U.S. Patent law and the term is open-ended, allowing for the presence of more than that which is recited so long as basic or novel characteristics of that which is recited is not changed by the presence of more than that which is recited, but excludes prior art embodiments.

Definitions

Antireflection or antireflective, as used herein, refers to a coating and/or mechanism that can effectively reduce light reflection from an optical surface by about 80% or more.

Hierarchical, as used herein, is generally understood in the art and refers to structures with multiple length scales.

General Discussion

In accordance with the purpose(s) of the present disclosure, as embodied and broadly described herein, embodiments of the present disclosure, in some aspects, relate to silicon nanostructures, methods of making silicon nanostructures, compositions including silicon nanostructures, and products including silicon nanostructures. The present disclosure includes materials including silicon nanostructures having a crown shape filled with mini silicon pillars (also herein referred to as nanostructures, nanoposts, and nanocylinders). Advantageously, the materials have antireflective properties in approximately the visible light spectrum (e.g. about 380 nm to 740 nm) and into the infra-red spectrum (e.g. about 760 to 1100 nm). Additionally, the materials can have superhydrophobic characteristics (e.g. the water contact angle of a water droplet on the material exceeds 150°), which can provide self-cleaning capabilities.

The materials described herein can be used in photovotaic applications such as solar cells, surface-enhanced Raman scattering (SERS) sensors, countertops, windows, vehicle coatings, weaponry (e.g. lenses), and other materials where antireflective and superhydrophobic properties are desired.

Embodiments of the present disclosure include a material as above, wherein the material is an antireflective material having a total specular reflection of less than 3% at a wavelength of about 400 nm to 1100 nm or about 400 nm to 800 nm. In some embodiments, the reflection is below about 2% or about 1%, or below about 0.5% at a wavelength of about 400 nm to 1100 nm or about 400 nm to 800 nm. This level of antireflection appears nonreflective to the human eye in the visible light spectrum.

The material forms a moth-eye-type pattern made of a plurality (e.g., 10 s to 100 s to 1000 s or more) of hierarchical nanostructures on a base substrate. In some embodiments, approximately 1 million closely packed hierarchical nanostructures can fit on a 1 $mm^2$ substrate. The hierarchical nanostructures are concave nanoposts filled with a plurality of nanocones. The surface (e.g. the top, concave surface of the nanoposts) of the hierarchical nanostructures can include an etched polyimide layer.

In some embodiments, the base substrate can be silicon or black silicon (BSi). Black silicon, as will be understood by one of ordinary skill in the art, can be a processed silicon substrate that has a very low light reflection and subsequent dark appearance, commonly produced by electrochemical etching of silicon. Other possible substrates can include a gallium arsenide (GaAs) substrate, a gallium antimonide (GaSb) substrate, indium phosphide (InP), and gallium nitride (GaN).

In some embodiments, the concave nanoposts are not uniformly spaced apart from one another. The material, including the nanoposts, can have a height of about 200 nm to about 3000 nm, or about 200 nm to 2000 nm. The concave nanoposts can be spaced about 10 nm to 1000 nm apart or about 10 nm to 100 nm between pairs of nanopost bases. Each of the nanopost bases can have an average diameter of about 70 nm to 2000 nm and an average height of about 200 nm to 3000 nm or about 200 nm to 2000 nm. The nanocones inside the concave nanoposts can each have an average height of about 20 nm to 500 nm and a diameter of about 10 nm to 200 nm or about 100 nm to 200 nm. The dimensions and spacing of the nanoposts and nanocones can vary according to the etching conditions (e.g. length of etching time and etching power). In general, larger heights of nanoposes and more closely spaced nanoposts produce better antireflection.

The material has superhydrophobic characteristics, having a water contact angle of about 150° to about 165° or about 130° to about 165°.

In some embodiments, the material can have a total specular reflection of less than 1% at a wavelength of about 400 nm to about 800 nm.

The present disclosure also includes methods of making antireflective materials as above. The method includes disposing a mask comprising an array of templating nanoparticles on a top surface of a base substrate, then etching the top surface of the base substrate. In some embodiments, the templating nanoparticles are silica nanoparticles. The templating nanoparticles can have a diameter of about 500 nm to 2 mm, about 700 nm to 1 μm, about 700 nm, or about 1 μm. In other embodiments, the templating nanoparticles can be titania, zirconia, or aluminia nanoparticles, or a combination thereof.

A polyimide layer can then be disposed on the concave nanoposts, followed by a second round of etching whereby nanocones are formed in the concave nanoposts. In some embodiments, the polyimide layer can be poly (4,4'-oxydiphenylene-pyromellitimide) tape. In some embodiments, the tape can be about 1 mm thick with; the tape width can vary and can be cut to size depending upon the need. In various embodiments, the etching is chlorine plasma-assisted reactive ion etching. Alternatives to polyimide for the etched layer can include such as PVC, PET, polyacrylates, cellulose polymers, as can be envisioned by one of ordinary skill in the art.

Examples

Now having described the embodiments of the disclosure, in general, the examples describe some additional embodiments. While embodiments of the present disclosure are described in connection with the example and the corresponding text and figures, there is no intent to limit embodiments of the disclosure to these descriptions. On the contrary, the intent is to cover all alternatives, modifications, and equivalents included within the spirit and scope of embodiments of the present disclosure.

Now turning to FIG. 1, the hierarchical nanocylinders (hNCs) (1) described herein are hollow posts (2) with near-vertical rims that encircle high-aspect-ratio silicon nano-cones (3). The cones can have a typical height-to-diameter ratio larger than 10.

Methods of Making: Fabrication of such hierarchical nanostructure comprises the Langmuir-Blodget (LB) coating method for assembling close-packed silica ($SiO_2$) nanoparticle (SiNP) arrays as etching masks on silicon wafers, a two-step chlorine plasma-assisted reactive ion etching (RIE), and an intermediate acid washing of the wafer for the removal of the SiNPs, as well as the application of Kapton® polyimide tape. The LB coating of SiNPs on various substrates is based on the assembly of colloidal SiNP at an air/water interface. In short, colloidal silica nanoparticles are suspended in ethylene glycol (EG) to make a 0.6 vol. % SiNPs-in-EG stock suspension. The stock is added dropwise along the sidewall of a glass container filled with DI water until a weak chromatic diffraction pattern covers the entire water surface. The pre-immersed single crystalline silicon (sc-Si) wafer is then withdrawn vertically from the water bath while the stock suspension is continuously added to replenish SiNPs that are transferred to the wafer surface from the air-water interface. The substrate withdraw speed is often set to lower than 1 mm/s for assembling high-quality transfer colloidal monolayers on the silicon wafers. During the first plasma etching step, the diameter of the templated nanoposts is determined by the size of the templating SiNPs, and their height can be tuned by varying the RIE duration. The wafer is then retrieved from the operation chamber and washed in 2 vol. % hydrogen fluoride (HF) aqueous solution for 2 min until all SiNPs are dissolved. After a thorough DI water rinse and blow-dry by air, a piece of polyimide tape (poly (4,4'-oxydiphenylene-pyromellitimide, Kapton® Dupont) is cut and pasted on the processed wafer surface. Finally, the wafer is etched again using the same RIE recipe.

Figures 2A, 2B, 2C, 2D, 2E, 2F, 2G, 2H:
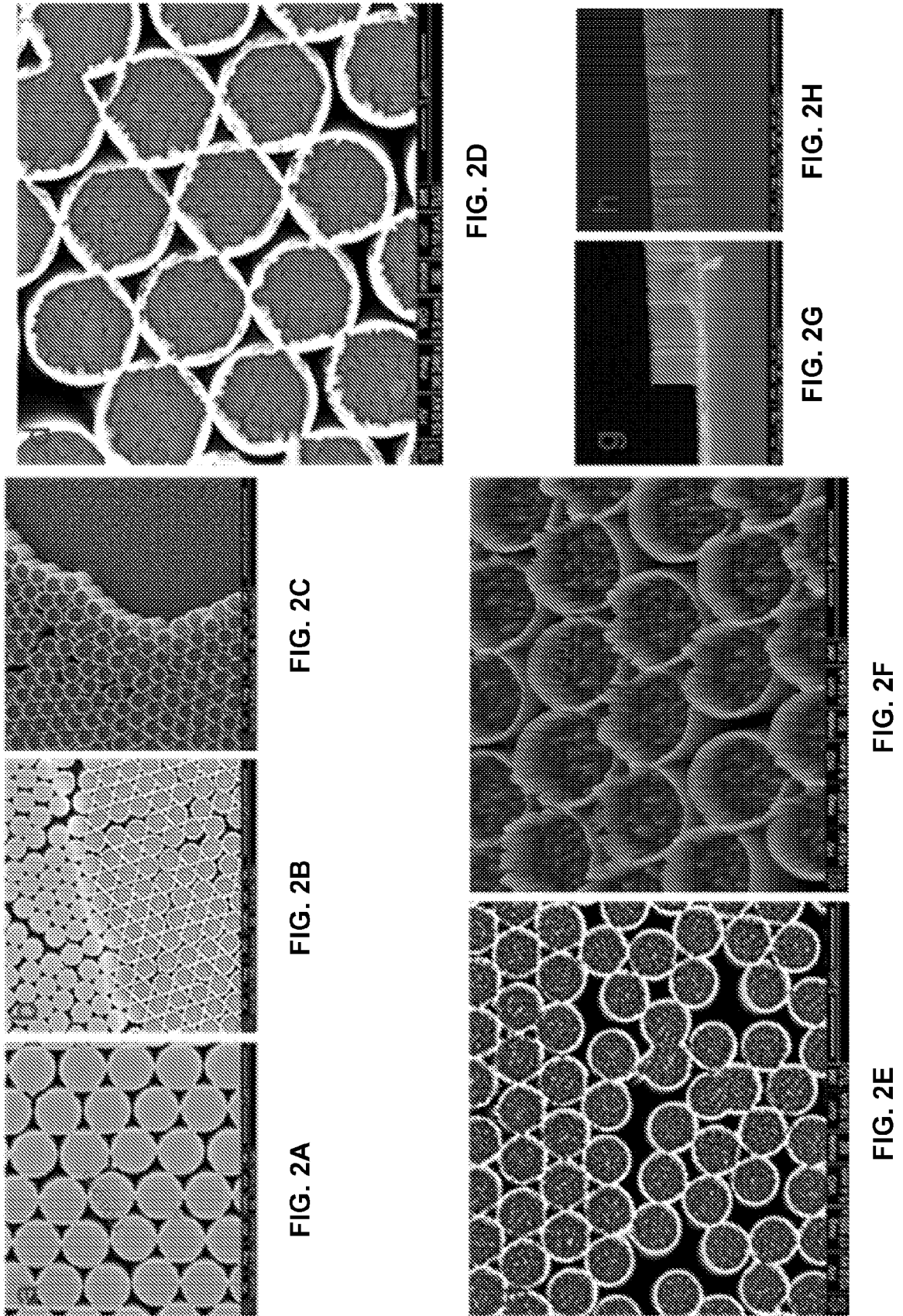
FIGS. 2A-2H provide example SEM images of the hierarchical nanocylinders in accordance with embodiments of the present disclosure.

FIGS. 2A-2H show the representative scanning electron microscope (SEM) images of the primary nanoposts (the stem portion of the hNCs) and hNCs. Upon the successful fabrication of close-packed hexagonal arrays of the nanopost and the removal of SiNPs from their top surfaces (FIG. 2A), a piece of Kapton tape is applied to the surface where it covers part of the area with nanoposts. After the second etching, a clear boundary is observable in FIG. 2B, above which is the region covered by the tape (and thus is etched only once) while the lower region is exposed to the second RIE etching. Considering that the top surfaces of the nanoposts are concave as being the inverse of the templating SiNPs, isotropically sputtered tape fragments would accumulate on the inner walls to act as passivation layers. Together with anisotropic (vertical) chlorine RIE etching, horizontal surfaces are etched more rapidly. In FIG. 2C, we compare the nanocylinder array to a defect area caused by low-quality LB coating. The defect area is only showing black silicon (blkSi) surface, of which the one-step fabrication has been disclosed by the authors previously. The integrity of the nanocylinders' rims are best-preserved in the exposed region immediately next to the edge of the tape (FIGS. 2B and 2D), from where it begins to decrease as the region gets more distant (FIGS. 2E and 2F). We hypothesize that such phenomenon is a result of decreasing passivation which indeed is caused by the lowering of the density of polyimide fragments that is sputtered onto the substrate in the second RIE step. Vertical etch rate can be estimated by measuring the nanocylinders' heights in FIGS. 2G and 2H, of which value of 2G is more reliable since the lower parts of the nanocylinders in 2H seem to have been hindered by the angle at which the image is taken, and thus can be underestimated.

Figure 3:
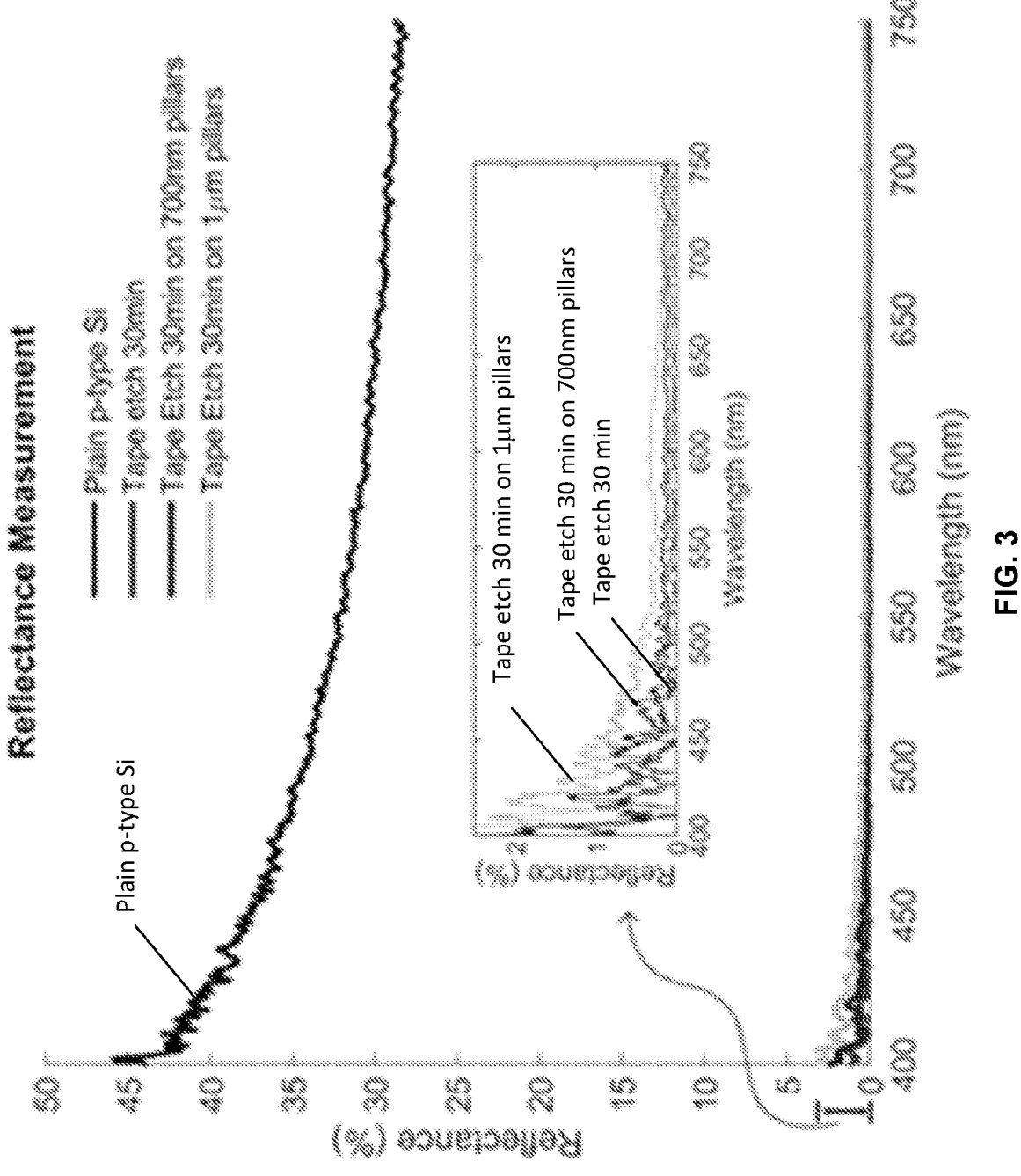
FIG. 3 provides normal-incident optical reflection spectra for plain silicon, hNCs templated from 700 nm and 1 μm SiNPs, and BSi over the visible wavelengths. Inset is a magnified view of the three antireflective samples.

Optical performance of the nanocylinders in the form of an antireflective coatings has been shown in FIG. 3. Normal-incidence reflection spectra for BSi surface, as well as 700 nm and 1 μm-templated hNCs are shown. All data for antireflective nanostructures (i.e., BSi and hNCs) are collected ~1 cm from the edges of the polyimide tape. All three samples exhibit extremely low reflections (largely below 0.5%), with the BSi being the lowest and the 1 μm-templated hNCs being the highest. The higher reflections for the hNCs than that for the BSi can be predicted from the fact that the hNCs are a combination of the BSi and the moth-eye nanostructures, which have reflection around 1% in the visible range. It seems that increasing the size of the templating SiNP would have an opposite effect on the antireflective properties for the hNCs. In general, antireflection coatings perform better with features (e.g. pillars) having widths of 500 nm or smaller because features that are sub-wavelength (400-800 nm for visible light) behave as an effective medium, while structures similar to the wavelength of light can result in light scattering. However, the hierarchical nanostructures described herein can have a width of greater than 500 nm and have antireflective properties because the nanoposts are large enough to contain smaller nanocones inside of them. The hierarchical structures can be created if the initial particles (and thus nanoposts) are large enough to contain the secondary structures (e.g. nanocones).

Figures 4A, 4B, 4C, 4D, 4E, 4F:
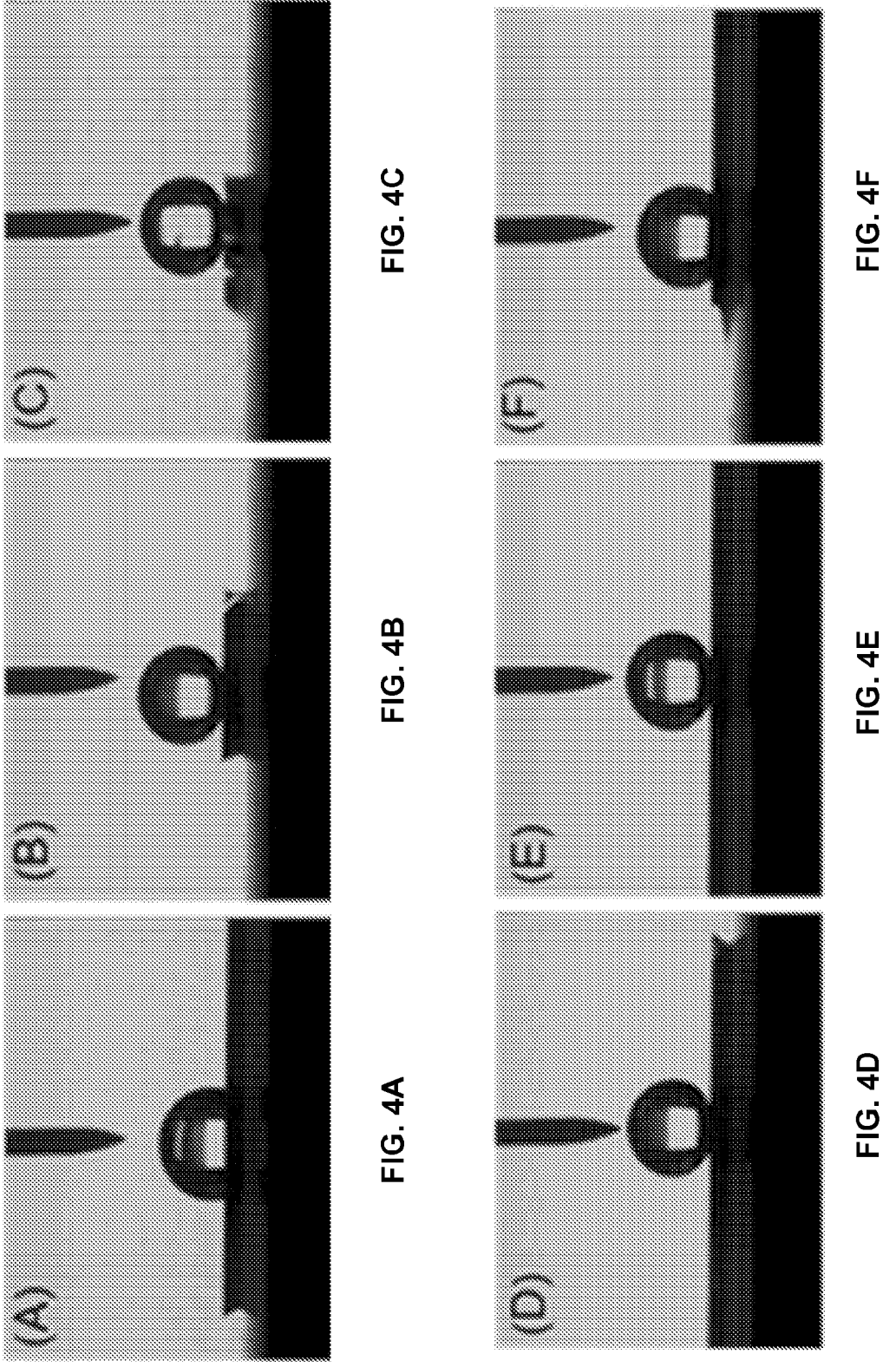
FIGS. 4A-4F are images taken using a CCD camera attached with a contact angle measurement unit showing contact angle measurements of various substrates treated by fluorosilane (FIG. 4A, bare silicon.
Figure 4G:
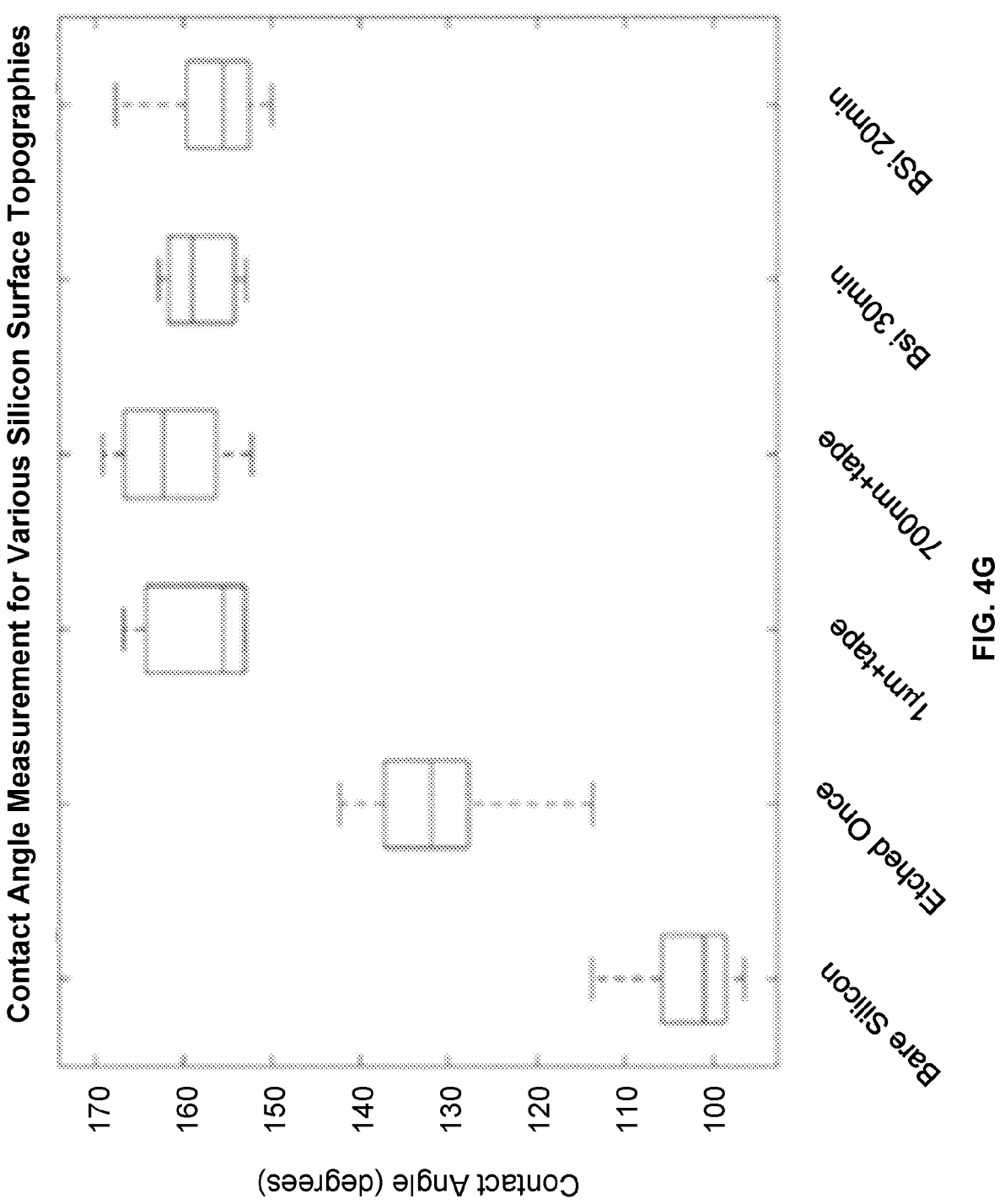
FIG. 4G is a graph comparing the contact angles of the substrates shown in FIGS. 4A-4F.

Self-cleaning capability of antireflective coatings on photovoltaics is an important addition in evaluating the practicability. As such, the superhydrophobicities of the hNCs and that of the blkSi surface are tested. Since the native oxide layer (SiO$_2$) on silicon substrate is hydrophilic, all sample are coated with a fluorosilane (heptadecafluoro-1,1,2,2-tetrahydrodecyltrichlorosilane) by vaporization to convert the surface from hydrophilic to hydrophobic. As shown in FIGS. 4A-4G, contact angles for water droplets on each of the substrates are measured. In FIG. 4A, the plain sc-Si surface exhibit the lowest water contact angle (wca). The primary nanocylinders (once-etched) surface begins to exhibit superhydrophobicity, with an average wca ~132°. The blkSi surfaces have better performances with wca in the range of 150°-160°, and longer etching time seems to increase their superhydrophobicities. The hNCs fabricated from 700 nm-templated SiNPs have the best performance with an average water contact angle of ~163°.

Figure 5:
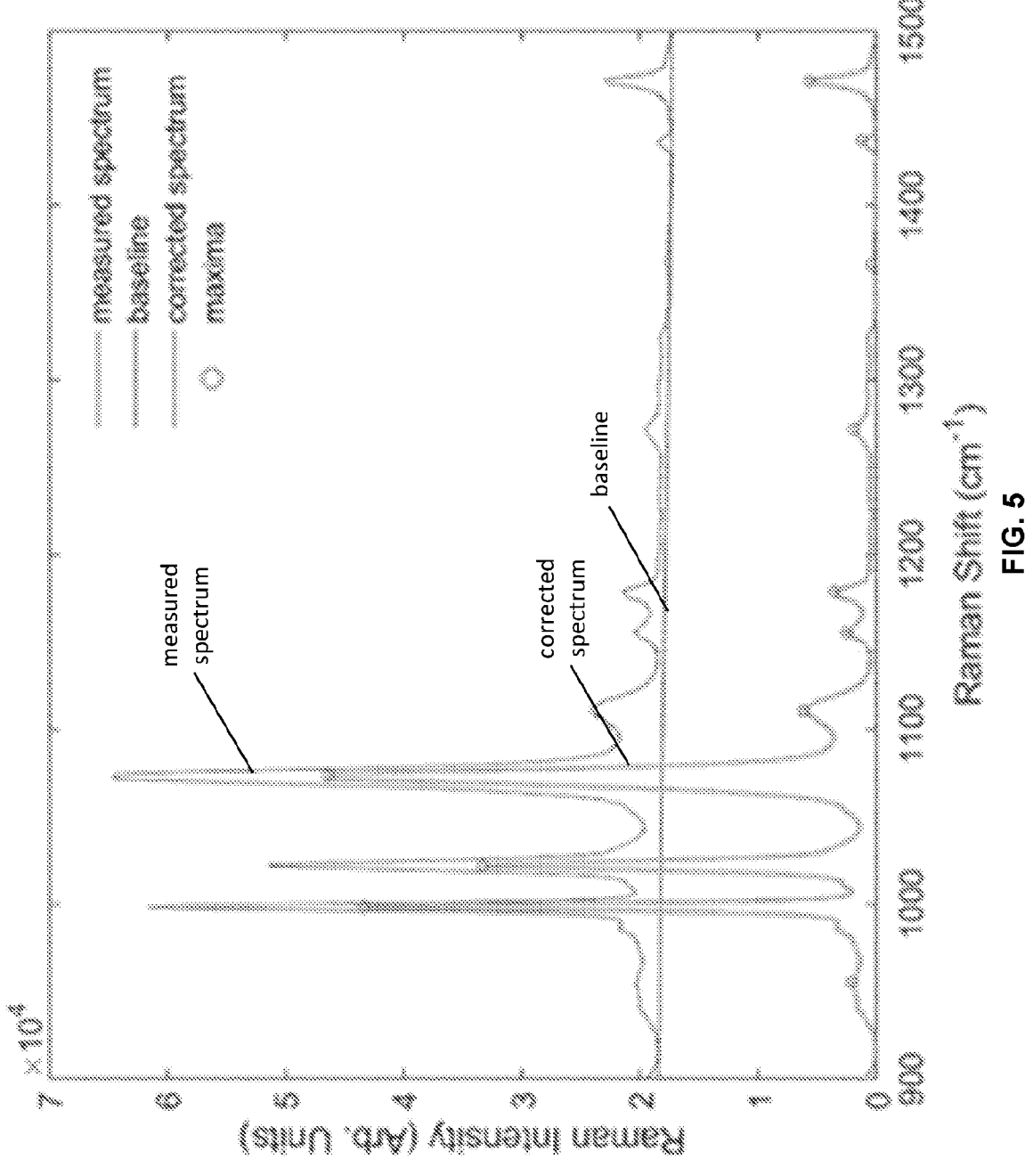
FIG. 5 graphs surface-enhanced Raman scattering (SERS) on the 700 nm-templated hNCs substrate. Inset is a mapping for 10 points along a 1000 nm line randomly selected on the substrate.

Surface-enhanced Raman scattering (SERS) aids greatly the capability of conventional Raman spectroscopy as it enables ultra-sensitive, even single-molecule level detection of a wide range of substances. The existence of surface 'hotspots' has been proved to be key mechanisms for SERS to take place. On solid substrates such as our blkSi and hNCs, these hotspots mainly exist where surface plasmonic behaviors are the most intense (i.e., at the peaks and troughs). Using a molecular probe, benzenethiol, the SERS effect of the hNCs is evaluated. As shown in FIG. 5, enormous enhancement can be achieved on hNCs substrate that is coated with 30 nm Au and is immersed in 5 mM benzenethiol solution for 30 min. On a plain silicon wafer coated with Au at the same thickness, no Raman signal is detected. The consistency of the hNCs substrate is also investigated. Inset of FIG. 5 shows a schematic demonstrating the process of mapping, and the result for 10 spots, 100 nm apart from each other.

Aspects of the Disclosure

The present disclosure will be better understood upon reading the following numbered aspects, which should not be confused with the claims. Any of the numbered aspects below can, in some instances, be combined with aspects described elsewhere in this disclosure and such combinations are intended to form part of the disclosure.

Aspect 1. An antireflective material comprising: a plurality of hierarchical nanostructures on a base substrate, wherein the hierarchical nanostructures comprise concave nanoposts filled with a plurality of nanocones; wherein the material has a total specular reflection of less than 3% at a wavelength of about 400 nm to about 1100 nm; and wherein the material further comprises an etched polyimide layer disposed on a superior surface of the hierarchical nanostructures.

Aspect 2. The material of Aspect 1, wherein the base substrate is silicon or black silicon.

Aspect 3. The material of any of Aspects 1 or 2, wherein the concave nanoposts are not uniformly spaced apart from one another.

Aspect 4. The material of any of Aspects 1-3, wherein the material has a height of about 200 nm to 3000 nm, wherein the concave nanoposts have a spacing of about 10 nm to 1000 nm between a pair of nanopost bases, wherein each of the nanopost bases have an average diameter of about 70 nm to 2000 nm, wherein each of the nanopost bases have an average height of about 200 nm to 3000 nm, wherein each of the nanocones inside the concave nanoposts can have an average height of about 20 nm to 500 nm, and wherein each of the nanocones can have a diameter of about 10 nm to 200 nm.

Aspect 5. The material of any of Aspects 1-4, wherein the material has a total specular reflection of less than 1% at a wavelength of about 400 nm to about 800 nm.

Aspect 6. The material of any of Aspects 1-5, wherein the material has a water contact angle of about 130° to about 165°.

Aspect 7. A method of making an antireflective material, comprising: disposing a mask comprising an array of templating nanoparticles on a top surface of a base substrate; etching the top surface of the base substrate; removing the templating nanoparticles, where the removal of the templating nanoparticles forms concave nanoposts; disposing a polyimide layer on the concave nanoposts; and etching the polyimide layer to form hierarchical nanocylinders, the nanocylinders comprising nanocones in concave nanoposts.

Aspect 8. The method of Aspect 7, wherein the polyimide layer comprises poly (4,4'-oxydiphenylene-pyromellitimide) tape.

Aspect 9. The method of any of Aspects 7 or 8, wherein the templating nanoparticles are silicon nanoparticles.

Aspect 10. The method of any of Aspects 7-9, wherein the templating nanoparticles have a diameter of about 500 nm to 2 mm.

Aspect 11. The method of any of Aspects 7-10, wherein the templating nanoparticles have a diameter of about 700 nm to 1 mm.

Aspect 12. The method of any of Aspects 7-11, wherein the etching is chlorine plasma-assisted reactive ion etching.

Aspect 13. The method of any of Aspects 7-12, wherein the base substrate is silicon or black silicon.

Aspect 14. The method of any of Aspects 7-13, wherein the concave nanoposts are not uniformly spaced apart from one another.

Aspect 15. The method of any of Aspects 7-14, wherein the antireflective material has a height of about 200 nm to 3000 nm, wherein the concave nanoposts have a spacing of about 10 nm to 1000 nm between a pair of nanopost bases, wherein each of the nanopost bases have an average diameter of about 70 nm to 2000 nm, wherein each of the nanopost bases have an average height of about 200 nm to 3000 nm, wherein the nanocones inside the concave nanoposts can each have an average height of about 20 nm to 500 nm, and wherein the nanocones can each have a diameter of about 10 nm to 200 nm.

Aspect 16. The method of any of Aspects 7-15, wherein the antireflective material has a total specular reflection of less than 1% at a wavelength of about 400 nm to about 800 nm.

Aspect 17. The method of any of Aspects 7-16, wherein the antireflective material has a water contact angle of about 130° to about 165°.

Aspect 18. A material comprising: a plurality of hierarchical nanostructures on a base substrate, wherein the hierarchical nanostructures comprise concave nanoposts filled with a plurality of nanocones.

Aspect 19. The material of Aspect 18, wherein the material has a height of about 200 nm to 3000 nm, wherein concave nanoposts have a spacing of about 10 nm to 1000 nm between a pair of nanopost bases, wherein each of the nanopost bases have an average diameter of about 70 nm to 2000 nm, wherein each of the nanopost bases have an average height of about 200 nm to 3000 nm, wherein each of the nanocones inside the concave nanoposts can have an average height of about 20 nm to 500 nm, and wherein each of the nanocones can have a diameter of about 10 nm to 200 nm.

Aspect 20. The material of Aspects 18 or 19, wherein the material has a total specular reflection of less than 3% at a wavelength of about 400 nm to about 1100 nm and wherein the material has a water contact angle of about 130° to about 165°.

Aspect 21. The material of any of Aspects 18-20, wherein the material further comprises an etched polyimide layer disposed on a superior surface of the hierarchical nanostructures and wherein the base substrate is silicon or black silicon.

Aspect 22. The material of any of Aspects 18-21, wherein the base substrate is silicon or black silicon.

Aspect 23. The material of any of Aspects 18-22, wherein the concave nanoposts are not uniformly spaced apart from one another.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. In an embodiment, "about 0" can refer to 0, 0.001, 0.01, or 0.1. In an embodiment, the term "about" can include traditional rounding according to significant figures of the numerical value. In addition, the phrase "about 'x' to 'y'" includes "about 'x' to about 'y'".

It should be emphasized that the above-described embodiments of the present disclosure are merely possible examples of implementations, and are set forth only for a clear understanding of the principles of the disclosure. Many variations and modifications may be made to the above-described embodiments of the disclosure without departing substantially from the spirit and principles of the disclosure. All such modifications and variations are intended to be included herein within the scope of this disclosure.

What is claimed is:

1. A method of making an antireflective material, comprising:

disposing a mask comprising an array of templating nanoparticles on a top surface of a base substrate by removing the base substrate from a solution having colloidal silica nanoparticles disposed on the surface of the solution, wherein as the base substrate is withdrawn from the solution the array of templating nanoparticles is disposed on the top surface of the base substrate;

etching the top surface of the base substrate;

removing the templating nanoparticles, where the removal of the templating nanoparticles forms concave nanoposts;

disposing a polyimide layer on the concave nanoposts; and etching the polyimide layer to form hierarchical nanocylinders comprising nanocones in concave nanoposts, wherein the base substrate and hierarchical nanocylinders are made of silicon or black silicon, and wherein the antireflective material has a water contact angle of about 130° to about 165°.

2. The method of claim 1, wherein the polyimide layer comprises poly (4,4'-oxydiphenylene-pyromellitimide) tape.

3. The method of claim 1, wherein the templating nanoparticles are silicon nanoparticles.

4. The method of claim 1, wherein the templating nanoparticles have a diameter of about 500 nm to 2 mm.

5. The method of claim 1, wherein the templating nanoparticles have a diameter of about 700 nm to 1 mm.

6. The method of claim 1, wherein the etching is chlorine plasma-assisted reactive ion etching.

7. The method of claim 1, wherein the concave nanoposts are not uniformly spaced apart from one another.

8. The method of claim 1, wherein the antireflective material has a height of about 200 nm to 3000 nm, wherein the concave nanoposts have a spacing of about 10 nm to 1000 nm between a pair of nanopost bases, wherein each of the nanopost bases have an average diameter of about 70 nm to 2000 nm, wherein each of the nanopost bases have an average height of about 200 nm to 3000 nm, wherein the nanocones inside the concave nanoposts can each have an average height of about 20 nm to 500 nm, and wherein the nanocones can each have a diameter of about 10 nm to 200 nm.

9. The method of claim 1, wherein the antireflective material has maximum specular reflection between 400 and 800 nm that is less than 1%.

10. The method of claim 1, wherein the antireflective material has a water contact angle of about 130° to about 165°.

11. A material comprising:

a plurality of hierarchical nanostructures on a base substrate, wherein the hierarchical nanostructures comprise concave nanoposts filled with a plurality of nanocones, wherein the base substrate and the plurality of hierarchical nanostructures are made of is silicon or black silicon, and wherein the material has a maximal specular reflection between 400 and 800 nm that is less than 3% and wherein the material has a water contact angle of about 130° to about 165°.

12. The material of claim 11, wherein the material has a height of about 200 nm to 3000 nm, wherein the concave nanoposts have a spacing of about 10 nm to 1000 nm between a pair of nanopost bases, wherein each of the nanopost bases have an average diameter of about 70 nm to 2000 nm, wherein each of the nanopost bases have an average height of about 200 nm to 3000 nm, wherein each of the nanocones inside the concave nanoposts can have an average height of about 20 nm to 500 nm, and wherein each of the nanocones can have a diameter of about 10 nm to 200 nm.

13. The material of claim 11, wherein the concave nanoposts are not uniformly spaced apart from one another.

* * * * *